United States Patent
Pang

(10) Patent No.: US 7,473,940 B2
(45) Date of Patent: Jan. 6, 2009

(54) COMPACT LED WITH A SELF-FORMED ENCAPSULATING DOME

(75) Inventor: Siew It Pang, Bayan Lepas (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 61 days.

(21) Appl. No.: 11/606,267

(22) Filed: Nov. 27, 2006

(65) Prior Publication Data

US 2008/0122123 A1     May 29, 2008

(51) Int. Cl.
*H01L 29/26*     (2006.01)

(52) U.S. Cl. ..................................... 257/100

(58) Field of Classification Search ............... 257/100, 257/E23.116, E23.123–E23.125, E23.133; 438/125–127
See application file for complete search history.

(56) References Cited

U.S. PATENT DOCUMENTS

| 6,489,637 | B1 * | 12/2002 | Sakamoto et al. | ............ 257/98 |
| 7,049,746 | B2 * | 5/2006 | Mano et al. | ............ 313/512 |

* cited by examiner

*Primary Examiner*—Zandra V. Smith
*Assistant Examiner*—Paul E Patton

(57) ABSTRACT

A light source including a die, substrate, and droplet of encapsulating material is disclosed. The die includes a semiconductor light-emitting device that is connected to first and second conducting traces on a first surface of the substrate. The droplet of encapsulate material overlies the die and is formed from a liquid precursor material that is characterized by a surface tension. The droplet has a periphery in contact with the first surface, the periphery having a shape determined by a predefined feature on the first surface and the surface tension of the liquid precursor material. The feature can include a recess in the first surface or a ring having an area that is raised above the first surface.

2 Claims, 5 Drawing Sheets

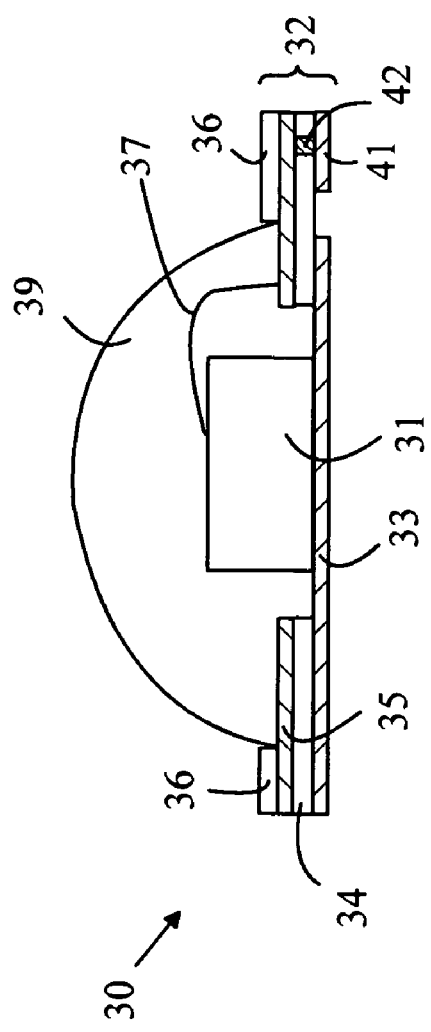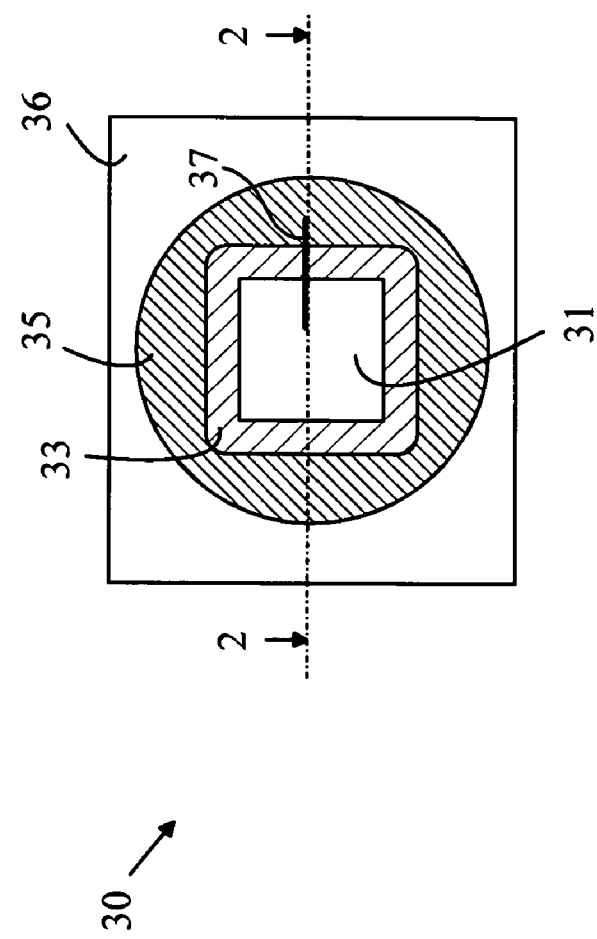

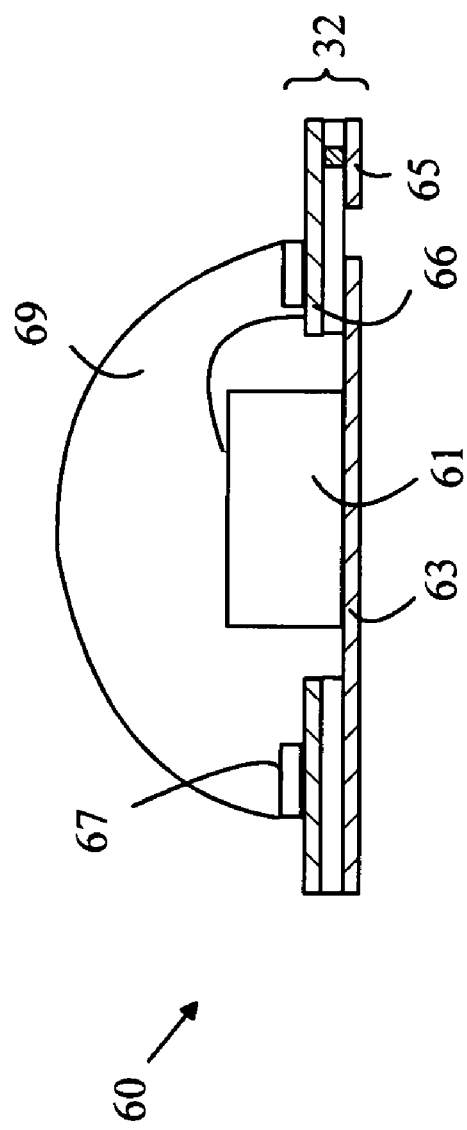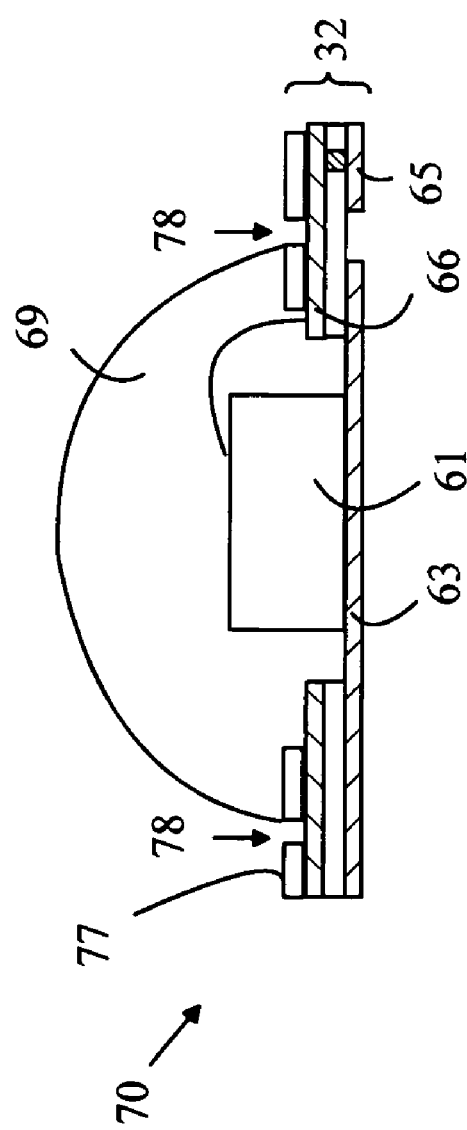

US 7,473,940 B2

COMPACT LED WITH A SELF-FORMED ENCAPSULATING DOME

BACKGROUND OF THE INVENTION

Light emitting diodes (LEDs) are replacing conventional light sources such as fluorescent and incandescent light bulbs in many applications. LEDs have similar electrical efficiency and longer lifetimes than fluorescent light sources. In addition, the driving voltages needed are compatible with the battery power available on many portable devices.

An LED light source typically includes one or more semiconductor dies that are mounted on a substrate that provides the power to the LED and a structure that can be utilized to mount the light source on the appropriate surface of the final product in which the light source is to function. For a number of reasons, the LED is typically covered with an encapsulating layer that has a spherical outer surface. First, the die must be protected from the environment.

Second, some light sources utilize a layer of phosphor that converts all or a portion of the light from the LED to light having a different spectrum such that the resultant light is perceived to be of the desired color. So-called "white" LEDs are constructed in this manner. The phosphor is typically provided as a powder that is suspended in the encapsulating layer.

Third, the efficiency of conversion of electrical power to light that is delivered by the LED is significantly improved if the LED is encapsulated in a layer of material that has an index of refraction that is intermediate between that of the material from which the LED layers are constructed and that of the surrounding air. Ideally, this layer has a curved outer surface with a radius of curvature that is sufficient to assure that the light leaving the top surface of the LED strikes the surface at an angle that is less than the critical angle.

For lighting applications, cost is also of primary concern. One method for providing the encapsulating layer that has the potential for providing a low cost utilizes a droplet of silicone that is deposited over the die after the die has been connected to an underlying substrate. The viscosity of the silicone is sufficient to assure that the droplet will solidify to the desired shape before the material spreads out excessively on the surface of the substrate in question. In addition, silicone has a number of properties that make it a good carrier for phosphors in phosphor converted light sources. In particular, silicone is resistant to damage by short wavelength light. Many phosphor-converted light sources utilize blue or UV light to excite the phosphors.

However, providing a reproducible encapsulation structure that does not entail utilizing some form of separate containment dam to prevent the silicone from spreading before it sets remains a challenge in light sources that do not utilize a reflector cup around the LED. If the light source includes a reflector cup that collects the light leaving the sides of the LED and redirects that light into the forward direction, the cup can act as a mold for the silicone encapsulation layer. However, in many applications, the silicone encapsulant is applied before the reflector is bonded to the light source. In addition, light sources that lack the reflectors, either because of cost or a need to maintain a low profile, must utilize some other means to provide reproducible encapsulation domes.

SUMMARY OF THE INVENTION

The present invention includes a light source including a die, substrate, and a droplet of encapsulating material. The die includes a semiconductor light-emitting device that is connected to first and second conducting traces on a first surface of the substrate. The droplet of encapsulant material overlies the die and is formed from a liquid precursor material that is characterized by a surface tension. The droplet has a periphery in contact with the first surface, the periphery having a shape determined by a predefined feature on the first surface and the surface tension of the liquid precursor material. In one aspect of the invention, the feature extends above or below the first surface by a distance less than the height of the die above the first surface. The feature can include a recess in the first surface, the periphery of the droplet being defined by an edge of the recess. In another aspect of the invention, the feature includes a ring having an area that is raised above the first surface.

BRIEF DESCRIPTION OF THE DRAWINGS

FIG. 1 is a top view of light source 30.

FIG. 2 is a cross-sectional view of light source 30 through line 2-2 shown in FIG. 1.

FIG. 4 illustrates another embodiment of a light source according to the present invention.

FIG. 5 illustrates another embodiment of a light source according to the present invention.

DETAILED DESCRIPTION OF THE PREFERRED EMBODIMENTS OF THE INVENTION

Figure 3:
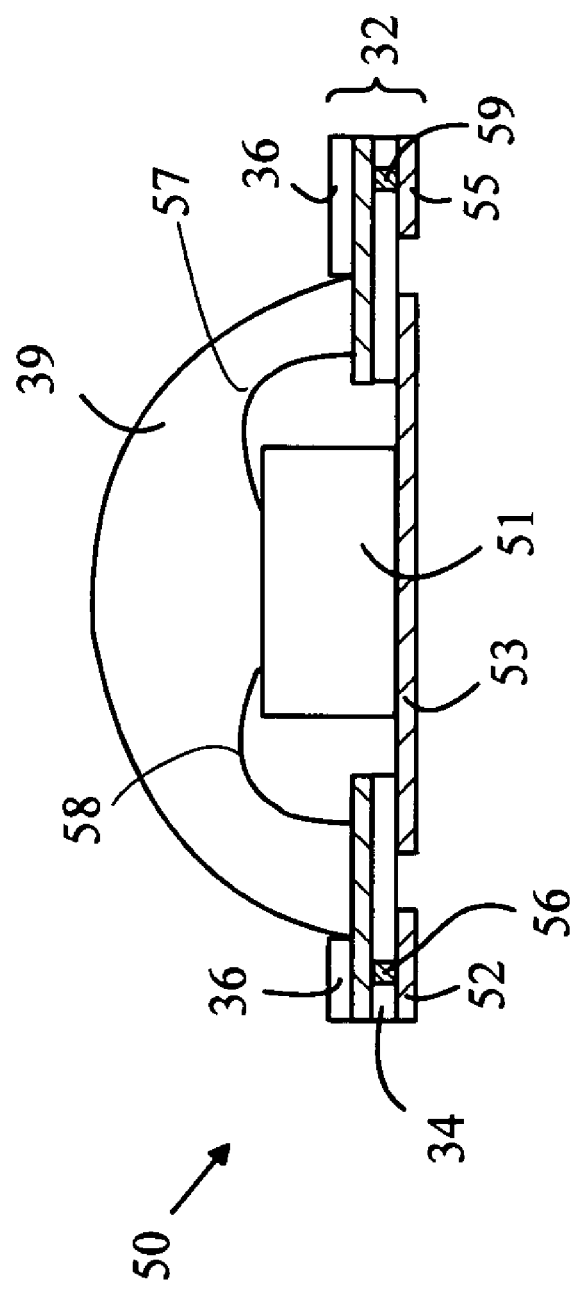
FIG. 3 is a cross-sectional view of another embodiment of a light source according to the present invention.

The manner in which the present invention provides its advantages can be more easily understood with reference to FIGS. 1 and 2, which illustrate a light source according to one embodiment of the present invention. FIG. 1 is a top view of light source 30, and FIG. 2 is a cross-sectional view of light source 30 through line 2-2 shown in FIG. 1. Light source 30 utilizes a die 31 that contains an LED. Die 31 is mounted on a carrier 32 and covered with an encapsulating dome 39.

Carrier 32 is constructed from an insulating substrate 34 that has two layers of metal deposited on opposite sides of substrate 34. Both of these layers are patterned to provide the various traces needed to connect and power die 31. Die 31 is mounted on and, connected electrically to, a pad on layer 33, which is used to provide one of the power connections to die 31. The other power terminal of die 31 is on the top of die 31 and is connected to a trace on layer 35 by a wire bond 37. This trace is connected to a trace 41 in layer 33 by a conducting via 42. Trace 41 is electrically isolated from the pad on which die 31 is mounted. Hence, light source 30 can be surface mounted on a printed circuit board or the like.

Carrier 32 includes a top layer 36 that is an insulator. A hole in layer 36 defines the boundary of dome 39. In one embodiment, dome 39 is silicone that is deposited over die 31 after die 31 has been mounted and connected electrically to the relevant traces. The silicone is deposited as a viscous liquid by an appropriate dispensing apparatus. Layer 36 has sufficient height to provide a step that contains the edge of the liquid droplet. In general, the minimum height of the step will depend on the material from which layer 36 is constructed and the material from which the dome is constructed. The surface tension of the liquid then sets the shape of the droplet. Since the periphery of the droplet is set by the hole in layer 36, the dome will be highly reproducible from light source to light source.

In one embodiment, carrier 32 is constructed from a flexible printed circuit carrier. Flexible circuit carriers constructed using polyamide-based insulating layers are available commercially from Dupont. The insulating layer is provided with a copper layer on the top and bottom surfaces thereof. The top and bottom surfaces can be lithographically patterned to provide the various traces in a manner analogous to that used with conventional printed circuit boards. The dielectric layer is preferably between 10 µm and 200 µm. The metal layers are preferably between 2 µm and 200 µm.

In addition, layers of polyamide without the metal layers are also available from Dupont. For example, a layer of 0.5 mil polyamide that is coated on one side with an adhesive that is 0.5 mil thick is available from Dupont. These non-metalized layers are available with a thin layer of adhesive on one surface. These layers are normally used as cover layers for covering the top circuit traces on the circuit carrier. Layer 36 discussed above can be constructed by punching holes through such a cover sheet or by having a special cover sheet made with the holes molded into the cover sheet. The cover layer would be positioned over the circuit carrier and bonded thereto such that the LED dies are located in the holes.

The above-described embodiments of the present invention utilize an attachment scheme in which one of the power terminals of the die is on the bottom surface of the die and the other is on the top surface. However, embodiments in which both of the power terminals are on the top surface of the die can also be constructed. Refer now to FIG. 3, which is a cross-sectional view of another embodiment of a light source according to the present invention. Those elements of light source 50 that serve functions analogous to elements shown in light source 30 have been given the same numeric designations and will not be discussed further here. Light source 50 differs from light source 30 in that die 51 has both power terminals on the top surface thereof. These power terminals are connected to traces in the top metal layer of carrier 32 by the wire bonds shown at 57 and 58. One of these traces is connected to an isolated electrode 52 in the bottom metal layer of carrier 32 by a conducting via 56, and the other trace is connected to a separate isolated layer 55 by another conducting via shown at 59. The die is mounted on a separate isolated pad 53 that is also formed in the bottom metal layer of carrier 32. Pad 53 can be bonded to an appropriate heat conducting surface on the printed circuit board to which light source 50 is connected in the final product. Die 51 is preferably mounted on pad 53 utilizing a layer of heat conducting adhesive.

The above-described embodiments of the present invention utilize an edge that steps up to define the boundary of the encapsulant dome. However, embodiments in which the defining edge is a step down can also be constructed. Refer now to FIG. 4, which illustrates another embodiment of a light source according to the present invention. Light source 60 includes a die 61 that houses an LED that is powered by a first contact on the bottom surface of the die and second contact on the top surface of the die. Die 61 is mounted on the bottom metal layer of carrier 32 on an electrode 63 that also acts as the electrical connection to the first contact. The second contact is connected to an electrically isolated electrode 65 on the bottom metal layer of carrier 32 by a conducting via that connects electrode 65 to an electrode 66 on the top metal layer. The top layer of carrier 32 is patterned to provide a step 67 that defines the boundary of dome 69.

The step down or step up edges described above can also be constructed by cutting a channel of the desired shape in the top surface of the carrier. Refer now to FIG. 5, which illustrates another embodiment of a light source according to the present invention. Light source 70 utilizes a step down arrangement similar to that discussed above with respect to light source 60. In light source 70, the step down feature is generated by cutting a ring 78 in the top layer 77 of carrier 32.

Figure 6:
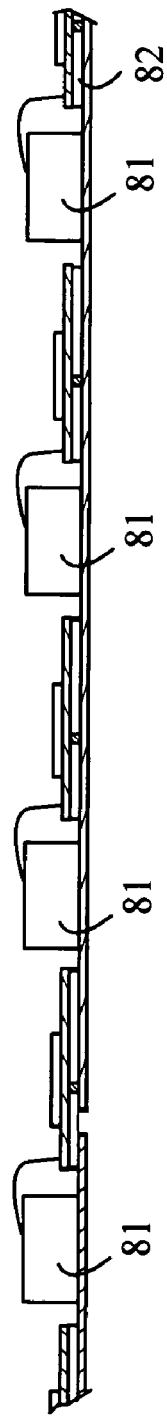
FIG. 6 is a cross-sectional view of a portion of a sheet of a carrier after the dies have been attached and connected electrically to the traces on the carrier.
Figure 7:
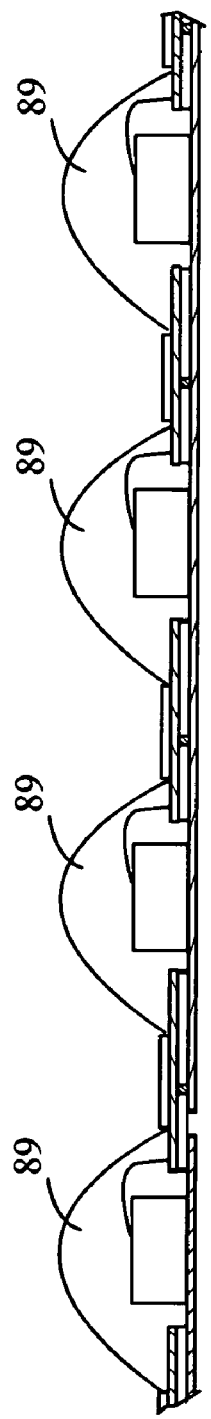
FIG. 7 illustrates the dies covered with silicon to form the domes shown at 89.
Figure 8:
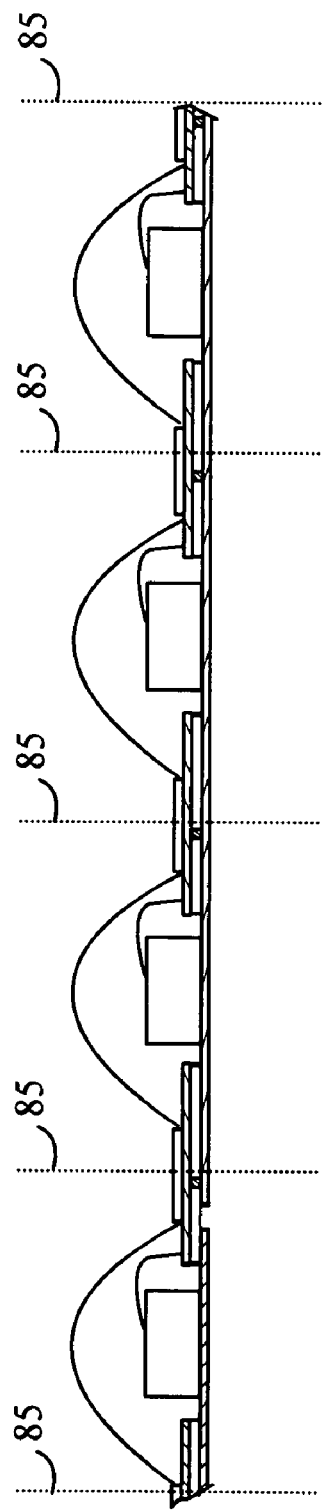
FIG. 8 illustrates the cutting lines on the carrier sheet to divide the sheet into the individual light sources.

Light sources according to the present invention can be constructed utilizing sheets of the carrier material that have been patterned to provide the top and bottom traces discussed above. Refer now to FIGS. 6-8, which illustrate one construction method for light sources according to the present invention. The fabrication process starts by attaching the dies to the sheet of carrier material. Refer to FIG. 6, which is a cross-sectional view of a portion of a sheet of carrier 82 after the dies shown at 81 have been attached and connected electrically to the traces on carrier 82. Referring to FIG. 7, silicone is then dispensed over each die to form the domes shown at 89. The silicone is preferably a clear silicone. The silicone could be modified, however, to include diffusing particles, phosphors, luminescent materials, dyes or other useful materials. Referring to FIG. 8, after the silicone has cured, the carrier sheet is cut along the lines shown at 85 in FIG. 8 to divide the sheet into the individual light sources.

Figure 9:
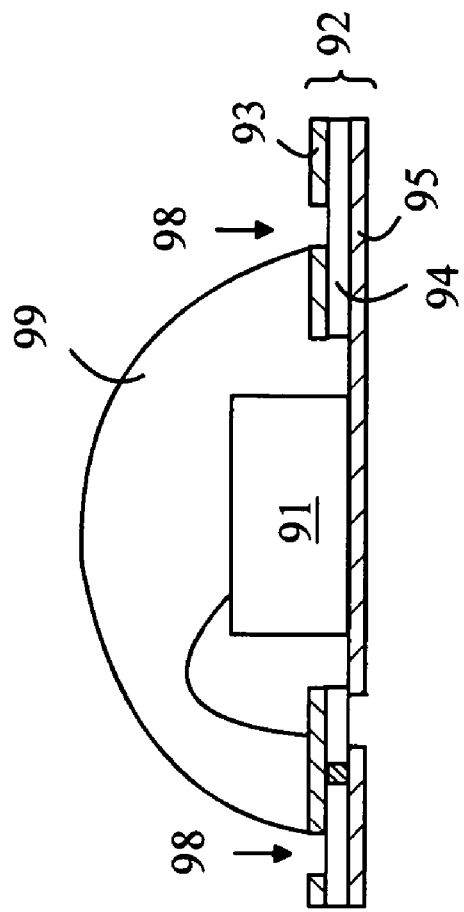
FIG. 9 is a cross-sectional view through a light source according to another embodiment of the present invention.

The above-described embodiments of the present invention utilize a feature in a dielectric cover layer that forms the top layer of the carrier to define the boundary of the encapsulating dome. However, the dome defining features could be placed in the top metal layer of the carrier. Refer now to FIG. 9, which is a cross-sectional view through a light source according to another embodiment of the present invention. Light source 90 is constructed on a carrier 92 having an insulating substrate 94 having metal layers on the top and bottom thereof. The top and bottom metal layers are shown at 93 and 95, respectively. These metal layers serve functions analogous to those described above, and hence, will not be discussed in detail here. For the purposes of the present discussion, it is sufficient to note that a trench 98 is cut in metal layer 93 to provide a step down feature that defines the boundary of encapsulating dome 99 over die 91. While light source 90 utilizes a step down feature to define the boundary of encapsulating dome 99, a step up feature could also have been utilized.

Figure 10:
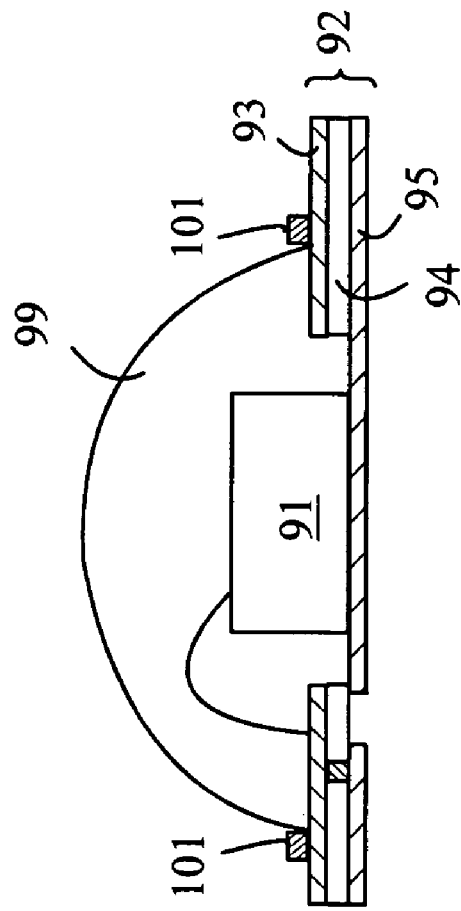
FIG. 10 is a cross-sectional view through a light source according to another embodiment of the present invention.

In addition, embodiments in which the dome-defining feature is deposited on the top metallic layer as a raised ring could also be constructed. Refer now to FIG. 10, which is a cross-sectional view through a light source according to another embodiment of the present invention. Light source 100 is constructed on a carrier 92 having an insulating substrate having metal layers on the top and bottom thereof. These metal layers serve functions analogous to those described above, and hence, will not be discussed in detail here. For the purposes of the present discussion, it is sufficient to note that a raised ring 101 has been deposited on the top surface of layer 93 to define the boundary of encapsulating dome 99. Ring 101 could be formed from a metal such as solder or from an insulating material that can be deposited on the surface of metal layer 93.

The above-described embodiments of the present invention utilize a dome that is formed from a droplet of silicone that is then allowed to solidify. However, any transparent material that can be deposited as a droplet of a precursor liquid that then sets into a self-supporting dome that can withstand the forces encountered by the dome during the normal operation of the light source, can be utilized. For example, the dome could be constructed from an epoxy that is cured either by heat or light. It should also be noted that the dome need not be solid. In fact, many silicone compounds remain pliable after curing.

The height of the surface feature that defines the dome is preferably less than the height of the die containing the LED. In one embodiment, the die has a height of 0.1 mm. In another embodiment, the die has a height of 0.35 mm.

Various modifications to the present invention will become apparent to those skilled in the art from the foregoing description and accompanying drawings. Accordingly, the present invention is to be limited solely by the scope of the following claims.

What is claimed is:

1. A light source comprising:

a die comprising a semiconductor light-emitting device;

a substrate comprising a first surface, said die being connected electrically to first and second conducting traces on said substrate and extending above said surface by a die height;

a droplet of encapsulate material over said die, said droplet being formed from a liquid precursor material that is characterized by a surface tension, wherein said droplet has a periphery in contact with said first surface, said periphery having a shape determined by a feature on said first surface and said surface tension of said liquid precursor material;

wherein said feature comprises a recess in said first surface, said periphery being defined by an edge of said recess.

2. A light source comprising:

a die comprising a semiconductor light-emitting device;

a substrate comprising a first surface, said die being connected electrically to first and second conducting traces on said substrate and extending above said surface by a die height;

a droplet of encapsulate material over said die, said droplet being formed from a liquid precursor material that is characterized by a surface tension, wherein said droplet has a periphery in contact with said first surface, said periphery having a shape determined by a feature on said first surface and said surface tension of said liquid precursor material;

wherein said feature comprises a ring surrounding said die, said periphery being defined by an edge of said ring;

wherein said ring comprises an area that is recessed below said first surface.

* * * * *

UNITED STATES PATENT AND TRADEMARK OFFICE
CERTIFICATE OF CORRECTION

| | | |
|---|---|---|
| PATENT NO. | : 7,473,940 B2 | Page 1 of 1 |
| APPLICATION NO. | : 11/606267 | |
| DATED | : January 6, 2009 | |
| INVENTOR(S) | : Siew It Pang | |

It is certified that error appears in the above-identified patent and that said Letters Patent is hereby corrected as shown below:

Title Page, Column 2 item (57); (Abstract), Line 5, delete "encapsulate" and insert --encapsulant--.

Column 5, Line 24, Claim 1, delete "encapsulate" and insert --encapsulant--.

Column 6, Line 13 (approx.), Claim 2, delete "encapsulate" and insert --encapsulant--.

Signed and Sealed this
Twenty-eighth Day of December, 2010

David J. Kappos
*Director of the United States Patent and Trademark Office*